United States Patent
Uya (10) Patent No.: US 8,216,873 B2
(45) Date of Patent: Jul. 10, 2012

(54) BACK-ILLUMINATED TYPE IMAGING DEVICE AND FABRICATION METHOD THEREOF

(75) Inventor: Shinji Uya, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 13/100,475

(22) Filed: May 4, 2011

(65) Prior Publication Data

US 2011/0207250 A1  Aug. 25, 2011

Related U.S. Application Data

(62) Division of application No. 12/138,294, filed on Jun. 12, 2008, now abandoned.

(30) Foreign Application Priority Data

Jun. 14, 2007  (JP) ................ P2007-157460

(51) Int. Cl.
  *H01L 21/28* (2006.01)
(52) U.S. Cl. .............. 438/70; 438/83; 438/98; 438/700; 257/E31.124; 257/E31.127
(58) Field of Classification Search ........... 438/70, 438/83, 98, 700; 257/E31.124, 127
See application file for complete search history.

(56) References Cited

U.S. PATENT DOCUMENTS

| | | |
|---|---|---|
| 2005/0104148 A1 | 5/2005 | Yamamoto et al. |
| 2006/0249803 A1 | 11/2006 | Yamamoto et al. |
| 2007/0235828 A1 | 10/2007 | Yoshihara et al. |
| 2009/0011534 A1 | 1/2009 | Yamamoto et al. |

FOREIGN PATENT DOCUMENTS

| | | |
|---|---|---|
| JP | 2005-150463 A | 6/2005 |
| JP | 2005-268738 A | 9/2005 |
| JP | 2005-285814 A | 10/2005 |
| JP | 2006-19653 A | 1/2006 |
| JP | 2006-339566 A | 12/2006 |
| JP | 2007-13089 A | 1/2007 |

OTHER PUBLICATIONS

Japanese Office Action issued Aug. 24, 2010, in Japanese Application No. 2007-157460.

*Primary Examiner* — Minchul Yang
(74) *Attorney, Agent, or Firm* — Birch, Stewart, Kolasch & Birch, LLP (57) ABSTRACT

Light is illuminated from a back-surface side of a silicon substrate 4. A back-illuminated type imaging device 100 reads out, from a front-surface side of the silicon substrate 4, charges that are generated in the silicon substrate 4 in response to the illuminated light, so as to perform imaging. The back-illuminated type imaging device 100 includes pad portions 17 formed on the back surface of the semiconductor substrate 4, and a plurality of pillars 9 that are formed in the semiconductor substrate 4, are made of a conductive material and electrically connect wiring portions 12 formed on the front surface of the semiconductor substrate 4 and the pad portions 17 to each other.

12 Claims, 6 Drawing Sheets

BACK-ILLUMINATED TYPE IMAGING DEVICE AND FABRICATION METHOD THEREOF

CROSS-REFERENCE TO RELATED APPLICATIONS

This application is a Divisional Application of application Ser. No. 12/138,294 filed on Jun. 12, 2008, now abandoned and for which priority is claimed under 35 U.S.C. §120 and this application claims priority of Japanese Patent Application No. 2007-157460 filed on Jun. 14, 2007 under 35 U.S.C. §119; the entire contents of both applications are incorporated herein by reference.

BACKGROUND OF THE INVENTION

1. Technical Field

The invention relates to a back-illuminated type imaging device in which light is illuminated from a back-surface side of a semiconductor substrate and charges that are generated in the semiconductor substrate in response to the light are read from a front-surface side of the semiconductor substrate to perform imaging.

2. Description of the Related Art

The following back-illuminated type imaging device has been proposed. That is, light is illuminated from a back-surface side of a semiconductor substrate. The back-illuminated type imaging device stores charges that are generated in the semiconductor substrate in response to the light, into charge storage areas formed on a front-surface side of the semiconductor substrate. The back-illuminated type imaging device outputs signals corresponding to the charges stored in the charge storage areas to the outside by a CCD or CMOS circuit formed on the front-surface side of the semiconductor substrate so as to perform imaging.

In order to absorb almost all of visible light, the semiconductor substrate (a photoelectric conversion area) the back-illuminated type imaging device, the semiconductor substrate (a photoelectric conversion area) is required to have a thickness of about 10 μm. For this reason, when the back-illuminated type imaging device is fabricated, at first structures such as the charge storage areas and the CCD are first formed on the front surface of the thick semiconductor substrate. Thereafter, a wiring layer is thereafter formed on the structures, and a supporting substrate is bonded thereto via an adhesive layer. Then, the semiconductor substrate is etched from the back-surface side until the thickness becomes 10 μm, for example. After the etching, structures such as color filters and microlenses are formed on the back surface of the semiconductor substrate so as to be aligned with the structures formed on the front-surface side of the semiconductor substrate.

In the back-illuminated type imaging device formed in such a manner, it is necessary to form a pad on the back-surface side or front-surface side of the semiconductor substrate so as to be connected to the wiring layer formed on the front-surface side of the semiconductor substrate. A general image sensor that is presently in wide use has such a structure that a pad opening is provided on a light incidence side. In accordance with this structure, test equipments for testing the functions of chips in the wafer are installed in a fabrication line. For this reason, if the pad opening is formed on the front-surface side of the semiconductor substrate in the back-illuminated type imaging device, it becomes necessary to drastically change or modify the test equipments, which may increase the fabrication cost.

Therefore, similarly to the general image sensor, various methods for providing the pad opening on the light incidence side (the back-surface side) have been proposed for the back-illuminated type imaging device. One method of them is to form a through hole from the back-surface side of the semiconductor substrate, thereby exposing from the back surface the pad connected to the wiring layer formed on the front-surface side (for example, see JP 2005-285814 A and JP 2006-19653 A). However, such a method has the following problems. That is, if the through hole is formed before the color filter or the microlens are formed on the back-surface side, a material for the color filter or the microlens may be left in the through hole and cannot be removed in subsequent steps. Or, since the substrate on which the material is to be deposited has a large step formed thereon, the thickness of the deposited material is not even, which may cause a fixed pattern noise that appears as oblique lines in an image. Moreover, even if the through hole is formed after the color filter or the microlens is formed, it is necessary to remove a photoresist that defines the through hole without causing any harm to the color filter or the microlens, which is very troublesome. In particular, as described above, in the semiconductor substrate having a thickness of 10 μm, the above problems may become conspicuous, and it becomes more difficult to perform such a removal work.

In light of the above, as disclosed in JP 2006-339566 A, the following method may be conceived. That is, a trench is formed in the semiconductor substrate so as to extend from the front surface of the semiconductor substrate to reach the back surface thereof; the trench is filled with a conductive material, and a pad is formed on the conductive material. It can be said that in principle, it is possible to fill the trench corresponding to the pad with the conductive material. However, usually, the pad has a size of 100 μm×100 μm; therefore, in order to form a trench having substantially the same size and fill the trench with conductive material, if a CVD process is used, it is necessary to form a layer of the conductive material to a thickness equal to or larger than 50 μm and then to remove the same thickness by an anisotropic etching process. Such a process step cannot be said to be practical as a semiconductor fabrication process.

If the size of the trench is decreased, it may not cause any problem in view of a fabrication process. However, in such a case, there arises a problem that the resistance of the conductive material filled in the trench may increase, which may affect the device characteristics.

SUMMARY OF THE INVENTION

The invention has been made in view of such circumstances, and provides a back-illuminated type imaging device that can prevent the fabrication cost and the resistance between pads and wirings from increasing even if pad openings is formed on a light incidence side.

According to an aspect of the invention, a back-illuminated type imaging device includes a semiconductor substrate, a pad portion, a wiring portion and a plurality of contact wiring portions. The semiconductor substrate includes a front surface and a back surface. Light is illuminated from the back-surface side of the semiconductor substrate. Charges that are generated in response to the light are read out from the front-surface side of the semiconductor substrate to perform imaging. The pad portion is formed on the back surface of the semiconductor substrate. The wiring portion is formed on the front surface of the semiconductor substrate. The plurality of contact wiring portions are formed in the semiconductor substrate and electrically connect the wiring portion formed on the front surface of the semiconductor substrate and the pad portion.

In the back-illuminated type imaging device, each contact wiring portion may be configured by a pillar made of a conductive material. The pillar extends from the front surface of the semiconductor substrate in a direction perpendicular to the front surface of the semiconductor substrate. The pillar reaches the back surface of the semiconductor substrate. The pad portion may be connected to one ends of the pillars. The wiring portion may be connected to the other ends of the pillars.

In the back-illuminated type imaging device, the plurality of pillars may be arranged two-dimensionally, when viewed in plan view.

In the back-illuminated type imaging device, portions of the plurality of pillars at which the pillars have a maximum width may have 2 μm or less in length.

The back-illuminated type imaging device may further include an alignment mark that is formed in the semiconductor substrate and is used to align components on the front-surface side of the semiconductor substrate with components on the back-surface side. The alignment mark may be formed by a pattern of a plurality of pillars that are made of a conductive material and extend in a direction perpendicular to the front surface of the semiconductor substrate.

In the back-illuminated type imaging device, the plurality of pillars, which form the alignment mark, may be arranged two-dimensionally.

In the back-illuminated type imaging device, the pattern of the plurality of pillars, which form the alignment mark, may be symmetric.

In the back-illuminated type imaging device, portions of the plurality of pillars at which the pillars have a maximum width may have 2 μm or less in length.

In the back-illuminated type imaging device, each of the pillars, which form the alignment mark, may extend from the front surface of the semiconductor substrate and may reach the back surface of the semiconductor substrate.

The back-illuminated type imaging device may further include a supporting substrate bonded to the front surface of the semiconductor substrate via an inorganic adhesive layer.

In the back-illuminated type imaging device, the supporting substrate may be made of the same material as the semiconductor substrate.

The back-illuminated type imaging device may further include a film that is made of the same material as the pad portion and is formed above the back surface of the semiconductor substrate. The film includes at least one of (i) a light shielding film for shielding a part of pixel portions formed in the semiconductor substrate from light and (ii) a light shielding film for shielding a boundary between the pixel portions from light.

According to another aspect of the invention, a method for fabricating a back-illuminated type imaging device in which light is illuminated from a back-surface side of a semiconductor substrate, and charges that are generated in response to the light are read out from a front-surface side of the semiconductor substrate to perform imaging, includes: forming a plurality of first through holes in a plane area, on which a pad portion to be formed on the back surface of the semiconductor substrate is to be formed, from the front-surface side of the semiconductor substrate so that the through holes extends from the front surface of the semiconductor substrate and reaches the back surface; filling the plurality of first through holes with a conductive material to form a plurality of first pillars made of the conductive material; forming a wiring portion on the front surface of the semiconductor substrate so that the wiring portion is connected to the plurality of first pillars; and after the wiring portion is formed, forming the pad portion on the back surface of the semiconductor substrate so that the pad portion is connected to the plurality of first pillars.

In the method for fabricating the back-illuminated type imaging device, in the forming of the first through holes, the plurality of first through holes may be formed so as to be arranged two-dimensionally, when viewed in plan view.

In the method for fabricating the back-illuminated type imaging device, in the forming of the first through holes, the plurality of first through holes may be formed so that portions of the first through holes at which the through holes have a maximum width have 2 μm or less in length.

In the method for fabricating the back-illuminated type imaging device, in the forming of the first through holes, a plurality of second through holes may be formed in a plane area, in which a alignment mark that is used to align components on the front-surface side of the semiconductor substrate with components on the back-surface side are to be formed, so that the second through holes extends from the front surface of the semiconductor substrate and reaches the back surface. In the filling of the first through holes, the plurality of second through holes may be filled with the conductive material to form a plurality of second pillars made of the conductive material. The alignment mark may be formed by the pattern of the plurality of second pillars.

In the method for fabricating the back-illuminated type imaging device in the forming of the first through holes, the plurality of second through holes may be formed so as to be arranged two-dimensionally, when viewed in plan view.

In the method for fabricating the back-illuminated type imaging device, in the forming of the first through holes, a pattern of the plurality of second through hole may be formed so as to be symmetric.

In the method for fabricating the back-illuminated type imaging device, in the forming of the first through holes, the plurality of second through holes may be formed so that portions of the second through holes at which the through holes have a maximum width have 2 μm or less in length.

The method for fabricating the back-illuminated type imaging device may further include forming pixel portions in the semiconductor substrate, the pixel portions having charge storage areas for storing therein the charges. The forming of the pad portion may include forming a film of a conductive material having a light shielding property, on the back surface, and removing the conductive material at portions outside at least one of a portion above a plane area in which the pad portion is formed, a portion above a part of the pixel portions, and a portion above a boundary between the pixel portions.

The method for fabricating the back-illuminated type imaging device may further include: after the pad portion is formed, forming color filters above the pixel portions, so as to correspond to the pixel portions; and after the pad portion is formed and before the color filters are formed, heating the semiconductor substrate.

In the method for fabricating the back-illuminated type imaging device, the semiconductor substrate may be a first semiconductor substrate of a SOI substrate. The SOI substrate includes the first semiconductor substrate, a second semiconductor substrate, and an oxide film sandwiched between the first and second semiconductor substrates. The method may further include: after the wiring portion is formed, bonding a supporting substrate on the front-surface side of the first semiconductor substrate via an inorganic adhesive film.

In the method for fabricating the back-illuminated type imaging device, the supporting substrate may be made of the same material as the first semiconductor substrate.

According to the above configurations and methods, it is possible to provide a back-illuminated type imaging device capable of preventing the fabrication cost and the resistance between pads and wirings from increasing even if a pad opening is provided on a light incidence side.

DETAILED DESCRIPTION OF EMBODIMENTS OF THE INVENTION

Hereinafter, embodiments of the invention will be described with reference to the accompanying drawings.

Figure 1:
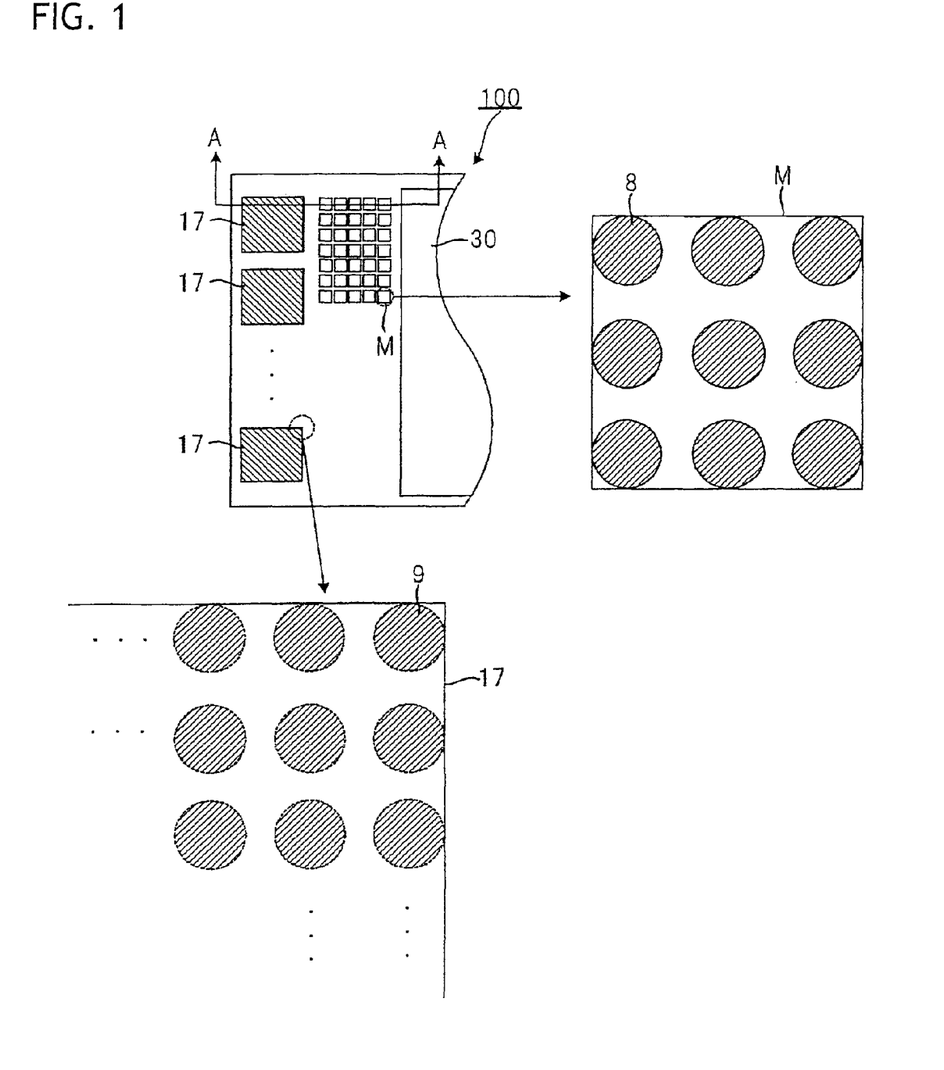
FIG. 1 is a schematic plan view of a back-illuminated type imaging device according to an embodiment of the invention, when viewed from a back-surface side.
Figure 2:
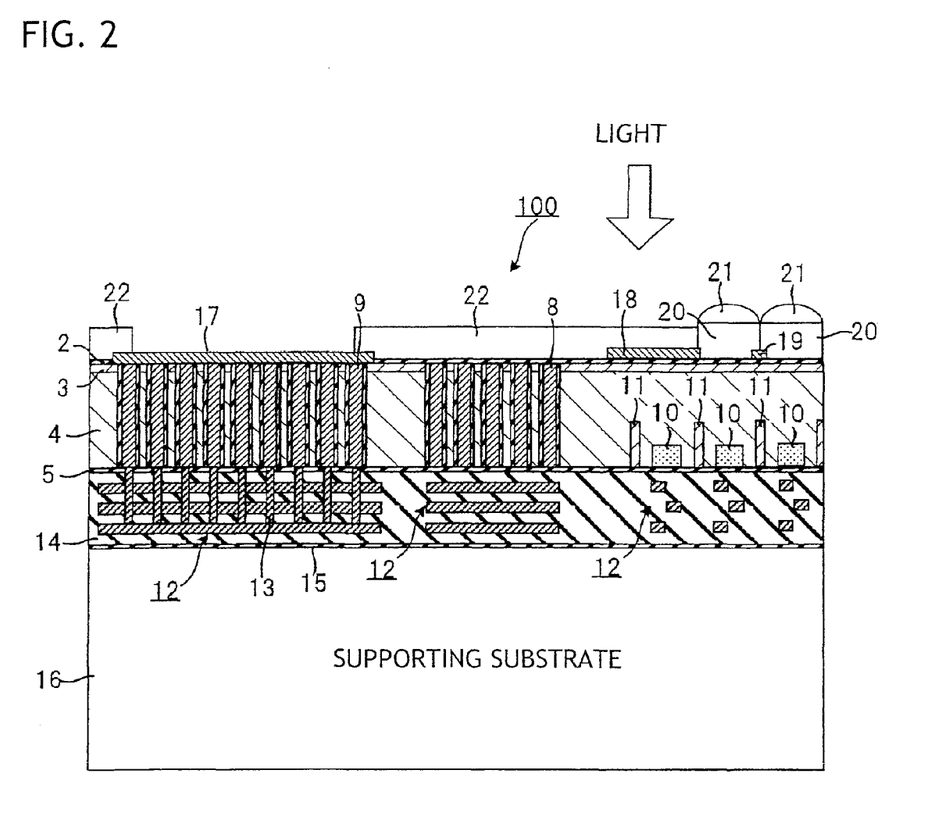
FIG. 2 is a schematic sectional view taken along the line A-A of FIG. 1.

FIG. 1 is a schematic plan view of a back-illuminated type imaging device according to an embodiment of the invention, when viewed from a light incidence side (a back-surface side). FIG. 2 is a schematic sectional view taken along the line A-A of FIG. 1.

As shown in FIG. 1, the back-illuminated type imaging device 100 includes an imaging area 30 for receiving light to perform imaging; a mark forming area in which formed are a large number of alignment marks M that are used to align components (charge storage areas for storing charges, a signal output portion for outputting signals corresponding to the charges stored in the charge storage areas, and the like) on a front-surface side opposite to the back surface, in which the imaging area 30 is formed, with components on the back-surface side; and a pad forming area in which a large number of pad portions 17 that are connected to wiring portions formed on the front-surface side are formed for inputting and outputting signals from and to the outside.

As shown by the enlarged view in FIG. 1, each alignment mark M is formed of a pattern of nine pillars 8 which are made of a conductive material (e.g., doped polysilicon) and which are two-dimensionally arranged in the vertical and horizontal directions. As shown in the figure, the nine pillars 8 are symmetric in the vertical and horizontal directions. Each pillar is a circular column. Since the pattern of the nine pillars 8 has the symmetrical arrangement, it is possible to detect one alignment mark M by using the nine pillars 8. As shown in FIG. 2, the pillars 8 are formed in an n-type silicon substrate 4, which is a semiconductor substrate, so as to extend from the back surface and reach the front surface.

As shown in FIG. 1 (enlarged view) and FIG. 2, the pad portions 17 are connected to the plurality of pillars 9, which are made of the conductive material (for example, the doped polysilicon) and are formed in the silicon substrate 4 below the pad portions 17 so as to extend from the back surface and reach the front surface. The plurality of pillars 9 are connected to wiring portions 12 formed on the front-surface side of the silicon substrate 4. As shown in the enlarged view of FIG. 1, the pillars 9 are arranged two-dimensionally so as to be symmetrical in the vertical and horizontal directions. Each pillar 9 is a circular column. Since the pillars 9 only need to electrically connect the pad portions 17 and the wiring portions 12 to each other, it is not necessary that the pillars 9 are arranged symmetrically. Moreover, it is not necessary that the pillars 9 are arranged two-dimensionally.

As shown in FIG. 2, when the back-illuminated type imaging device 100 is used, light is incident thereon from the back-surface side of the silicon substrate 4. Specifically, light is focused by microlenses 21 and filtered by color filters 20, and then the light is incident to the silicon substrate 4. Charges that are generated in the silicon substrate 4 are stored in charge storage areas 10 and signals corresponding to the stored charges are output to the outside by a MOS circuit including MOS transistors. In this specification, a positional relationship among components will be defined using the front and back surfaces of the silicon substrate 4 as a reference. For example, when the front surface of the silicon substrate 4 is used as the reference, the light incidence direction is defined as an upper direction of the front surface, while when the back surface of the silicon substrate 4 is used as the references, the direction opposite to the light incidence direction will be defined as an upper direction of the back surface.

The back-illuminated type imaging device 100 includes the silicon substrate 4, an insulating film 5 that is made, for example, of $SiO_2$ and is formed on the front surface of the silicon substrate 4, an insulating film 14 formed on the insulating film 5, and a supporting substrate 16 formed on the insulating film 14 via an adhesive film 15.

The adhesive film 15 is formed of an organic material film made such as $SiO_2$ and is formed by a CVD process. The supporting substrate 16 is preferably made of a material having a thermal expansion coefficient close to that of the silicon substrate 4. This is because Such selection of material can decrease damages to the silicon substrate 4, which may be caused by a sintering process described later. However, if the supporting substrate 16 is made of a material such as Pyrex which is included in such materials, white defects may occur due to the radioactive rays (especially, an α ray) emitted from radioactive isotopes contained in the material. The white defects may occur even after the back-illuminated type imaging device 100 is assembled into a camera, and the defects are referred to as post-generated white defects. The post-generated white defects may cause a serious problem since they are not subjected to an image correction process. For this reason, it is more preferable that the supporting substrate 16 is made of a material that has a thermal expansion coefficient close to that of the silicon substrate 4 and contains few radioactive isotopes.

Furthermore, the supporting substrate 16 is preferably made of a highly transparent material. If the supporting substrate 16 is transparent, it becomes possible to detect the alignment marks M from the front-surface side of the back-illuminated type imaging device 100 by using an exposure apparatus having alignment mechanisms above and below the exposure apparatus, thereby forming the components on the back-surface side with reference to the alignment marks M. In this case, it is not necessary to form the alignment marks M in the silicon substrate 4 but the alignment marks M may be formed on the front surface of the silicon substrate 4.

A glass substrate can be exemplified as the highly transparent material. However, it is hard to be used since its thermal expansion coefficient differs from that of silicon and it contains many radioactive isotopes. Therefore, silicon is preferably used for the supporting substrate 16 since the silicon's thermal expansion coefficient is close to that of the silicon substrate 4 and the silicon contains few radioactive isotopes. However, since the silicon is not transparent, it cannot be used with the exposure apparatus having the alignment mechanisms above and below the exposure apparatus. Therefore, in this embodiment, the alignment marks M that are visible from the back-surface side are formed.

In a portion of the silicon substrate 4 where the imaging area 30 is located, a large number of pixel portions are formed two-dimensionally. Each pixel portion includes a charge storage area 10 for storing the charges, which are generated in the silicon substrate 4 in response to the incidence light, and components (not shown) of a MOS circuit having MOS transistors for reading out signals corresponding to the charges stored in the charge storage area 10. Moreover, pixel separation areas 11 for separating the pixel portions 10 from each other are formed on an inner side of the front surface of the silicon substrate 4.

A highly doped p-type impurity region 3 for blocking dark current is formed on an inner side of the back surface of the silicon substrate 4. In the pad forming areas of the silicon substrate 4, a plurality of the pillars 9 (only nine pillars are shown in the drawing for the sake of simplicity) extending from the back surface of the silicon substrate 4 and reaching the front surface are formed below the large number of pad portions 17, thereby electrically connecting the pad portions 17 to the plurality of pillars 9. In the mark forming area of the silicon substrate 4, the plurality of pillars 8 (only five pillars are shown in the drawing for the sake of simplicity) extending from the back surface of the silicon substrate 4 and reaching the front surface are formed in positions where the plurality of alignment marks M are to be formed. The pillars 8 and 9 have the same size, when viewed in a plan view. Preferably, in view of easiness of fabrication, portions of the pillars where they have the maximum width have 2 μm or less in length (in the case of a circular column, they have a diameter equal to or less than 2 μm). The side walls of the pillars 8 and 9 are covered with insulating films.

Also, the pillars 8 and 9 may have mutually different sizes. Furthermore, the respective pillars 9 connected to the pad portions 17 may not have the same size, that is, may have different sizes. However, in any case, it is preferable that the size of the pillars 8 and 9 is set equal to or smaller than 2 μm. Also, the pillars 8 do not necessarily extend from the back surface of the silicon substrate 4 and reach the front surface. The pillars 8 may be buried in the silicon substrate 4 so that the pillars 8 are detectable from both the front and back-surface sides of the silicon substrate 4. From the same reason, the pillars 8 are not necessarily made of the conductive material similar to the pillars 9. However, it is to be noted that if the pillars 8 and 9 are made formed of a columnar conductive material that extends from the back surface of the silicon substrate 4 and reach the front surface, they can be formed simultaneously with each other, which is advantageous for the fabrication process.

The back-illuminated type imaging device 100 further includes: an oxide film 2 formed on the back surface of the silicon substrate 4 except the pad portions 17; a light shielding film 18 formed on the oxide film 2 above pixel portions for black level detection; a light shielding film 19 for preventing color mixing between pixels, formed on the oxide film 2 above the pixel separation areas 11, which separate the pixel portions, excluding the pixel portions for black level detection; the color filters 20 formed on the oxide film 2 above the pixel portions; the microlenses 21 formed on the color filters 20; and a material film 22 made of the materials, which are used to form the color filters 20 and the microlenses 21. In the material film 22, openings are formed on the pad portions 17, and the pad portions 17 are exposed through the openings.

It is preferable that the pad portions 17, the light shielding film 18, and the light shielding film 19 are made of the same material. If they are made of the same material, they can be formed at the same process step, which advantageous for the fabrication process. As a material that has light shielding property and allows the pad portions 17 to function properly, aluminum can be exemplified.

In the insulating film 14, formed are the wiring portions 12 such as various wirings connected to the components of the MOS circuit, which outputs signals corresponding to the charges stored in the charge storage areas 10 of the silicon substrate 4, and connected to a peripheral circuit. In the example shown in the figure, the wiring portions 12 have a three-layer wiring structure. The wiring portions 12 include contact wirings 13 that (i) connect various wirings connected to the components of the MOS circuit and the peripheral circuit and (ii) the pillars 9 to each other. With this configuration, the wiring portions 12 and the pad portions 17 are electrically connected to each other via the pillars 9.

Next, a method for fabricating the back-illuminated type imaging device 100 having such configuration will be described.

FIGS. 3 to 8 are schematic sectional views showing the back-illuminated type imaging device 100 at respective fabrication process steps.

Figure 3:
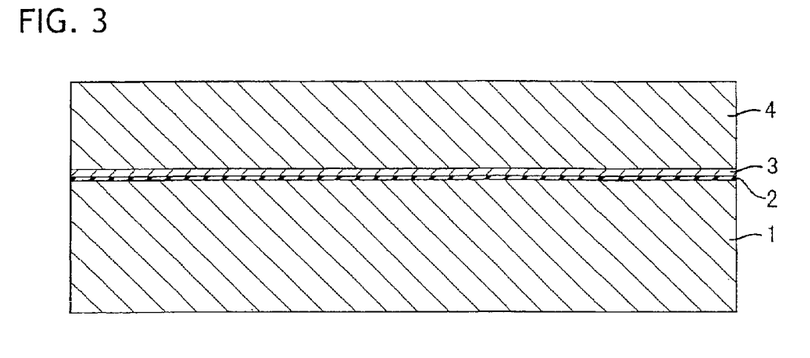
FIG. 3 is a schematic sectional view showing the back-illuminated type imaging device 100 during fabrication process steps.
Figure 4:
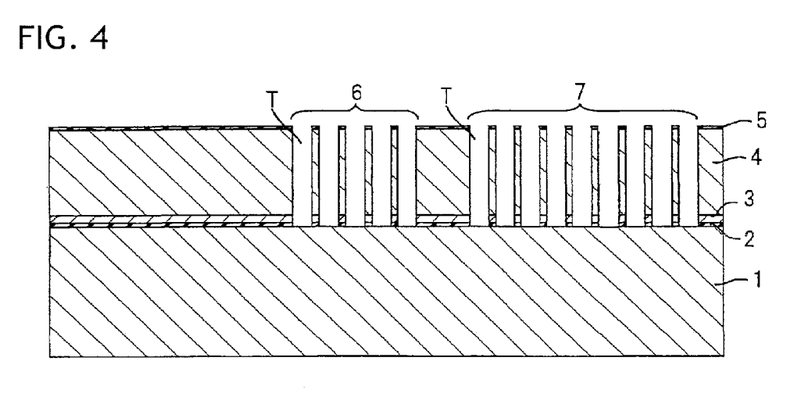
FIG. 4 is a schematic sectional view showing the back-illuminated type imaging device 100 during the fabrication process steps.
Figure 5:
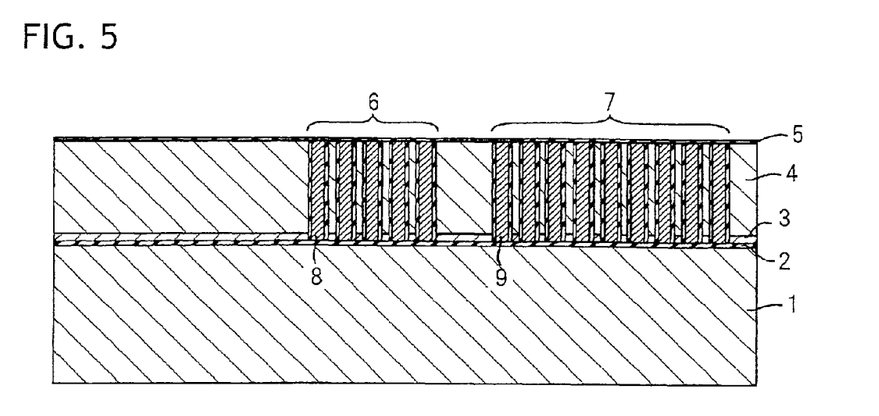
FIG. 5 is a schematic sectional view showing the back-illuminated type imaging device 100 during the fabrication process steps.
Figure 6:
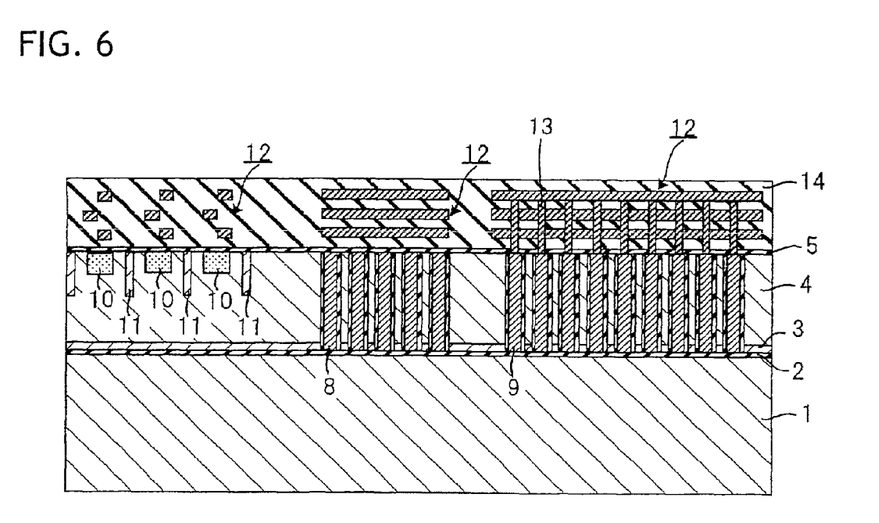
FIG. 6 is a schematic sectional view showing the back-illuminated type imaging device 100 during the fabrication process steps.
Figure 7:
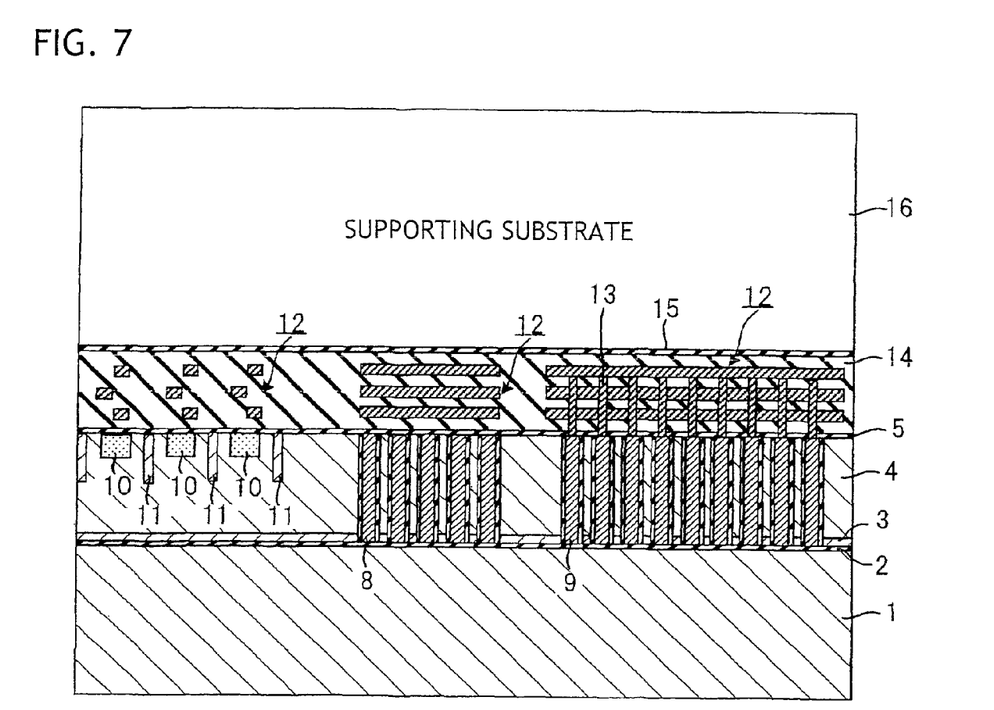
FIG. 7 is a schematic sectional view showing the back-illuminated type imaging device 100 during the fabrication process steps.

First, as shown in FIG. 3, an SOI substrate is prepared to include the n-type silicon substrate 4 in which a p-type impurity layer 3 is doped in an inner side from the back surface, an n-type silicon substrate 1, and an oxide film 2 formed between the back surface of the silicon substrate 4 and the silicon substrate 1.

Next, a SiO$_2$ film, for example, is formed on the front surface of the silicon substrate 4 to form the insulating film 5, and a resist mask pattern is formed on the insulating film 5 by a photolithographic process. The resist mask pattern has openings formed thereon in positions where the pillars 8 and 9 are to be formed. Subsequently, portions of the insulating film 5, the silicon substrate 4 and the oxide film 2 which are below the mask openings are selectively etched and removed via the resist mask pattern to form through holes T having a circular column shape in a mark forming area 6 and a pad forming area 7 (see FIG. 4). The resist mask pattern is designed so that the through holes T have a diameter of 0.8 μM, for example.

Next, the side walls of the through holes T are oxidized to form an insulating film on the side walls. A doped polysilicon film is formed as a conductive material layer on the insulating film 5. Subsequently, the doped polysilicon film is etched back to bury the dope polysilicon in the through holes T, and exposed surfaces of the doped polysilicon are oxidized to form the pillars 8 and 9 (see FIG. 5).

Next, the alignment marks M formed of the pillars 8 are detected from the front-surface side of the silicon substrate 4, and with reference to the detected alignment marks M, the pixel portions including the charge storage areas 10 and the pixel separation areas 11 are formed in the inner side of the silicon substrate 4 from the front surface of the silicon substrate 4 by a conventional process. Subsequently, the components of the MOS circuit, the peripheral circuit, and the wiring portions 12 are formed on the insulating film 5, and the insulating film 14 is formed thereon to planarize the surface (see FIG. 6). In this case, the contact wirings 13 of the wiring portions 12 are formed by forming openings in portions of the insulating film 5 above the pillars 9 and filling the openings with polysilicon.

Next, the supporting substrate 16 (made of silicon) is prepared to have on a front surface thereof an adhesive film 15 that is made of $SiO_2$ and formed by the CVD process. The supporting substrate 16 is bonded to the insulating film 14 via the adhesive film 15 by a direct bonding method (see FIG. 7). Subsequently, the silicon substrate 1 is etched and removed to expose the oxide film 2 with the supporting substrate 16 being used as a base layer (see FIG. 8).

Figure 8:
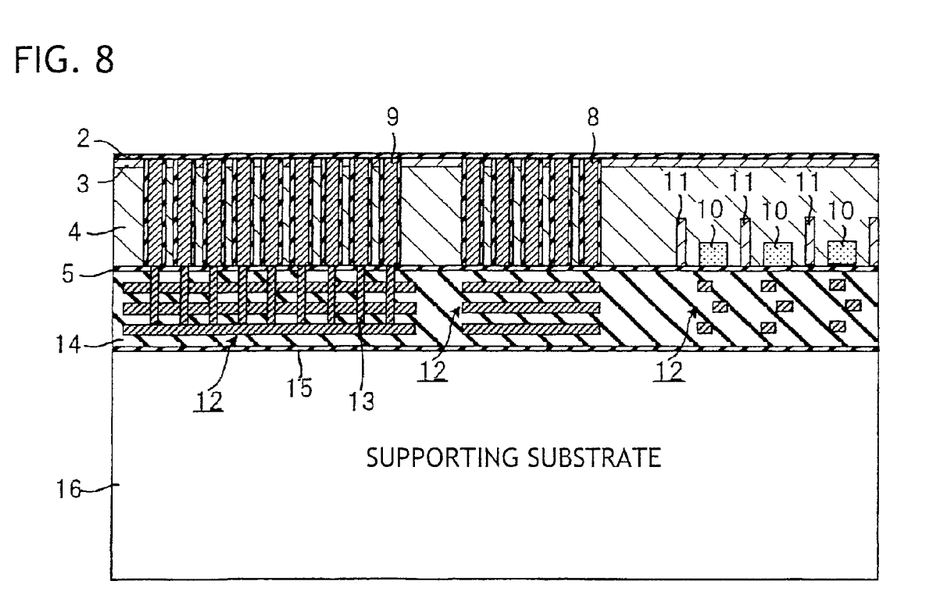
FIG. 8 is a schematic sectional view showing the back-illuminated type imaging device 100 during the fabrication process steps.

Next, portions of the oxide film 2 on the pad forming areas 7 are etched and removed to expose the pillars 9. Thereafter, an aluminum film, for example, is formed as a conductive material layer on the oxide film 2. Subsequently, a resist mask pattern is formed on the aluminum film so that the resist mask pattern has openings in positions outside (i) the pad forming areas 7, (ii) a portion above the pixel portions for black level detection and (iii) a portion above the pixel separation areas 11 between the pixel portions. Then, the aluminum film is etched via the resist mask pattern to form pad portions 17 and the light shielding films 18 and 19.

Next, in order to secure the electrical connection between the doped polysilicon constituting the pillars 9 and the aluminum film constituting the pad portions 17, a heating treatment (sintering) is performed in a hydrogen-containing atmosphere at a temperature around 400° C. Subsequently, the color filters 20 and the microlenses 21 are formed. Finally, openings are formed at portions of the material film 22, which is formed when the color filters 20 and the microlenses 21 are formed, above the pad portions 17 to expose the pad portions 17. Thereby, the back-illuminated type imaging device 100 shown in FIG. 1 is obtained.

As described above, according to the back-illuminated type imaging device 100, the device has the structure that the pad portions 17 formed on the back-surface side of the semiconductor substrate 4 and the wiring portions 12 on the front-surface side are electrically connected to each other via the plurality of pillars 9. Therefore, it is possible to perform the electrical connection between the pad portions 17 and the wiring portions 12 while suppressing the resistance between the pad portions 17 and the wiring portions 12 to a low level even if the size of the pillars 9 is not increased. Since the size of the pillars 9 can be decreased (for example, to 2 μm or less), if the above-described fabrication method is employed, it is possible to decrease the process load of filling the through hole T with the conductive material, which reduces the fabrication cost.

Moreover, according to the back-illuminated type imaging device 100, the alignment marks M are formed of the pattern of the plurality of smaller pillars 8. Therefore, it is possible to decrease the process load of forming the alignment marks M, which decreases the fabrication cost. In addition, since the pillars 8 are made of the same material and have the same length as the pillars 9, it is possible to form the pillars 8 simultaneously with the pillar 9 as described in the fabrication method, which reduces the fabrication cost.

In addition, according to the back-illuminated type imaging device 100, the semiconductor substrate 4 and the supporting substrate 16 are bonded to each other via an inorganic material. Therefore, a sintering process for securing the electrical connection between the pad portions 17 and the pillars 9 does not weaken the adhesion force between the semiconductor substrate 4 and the supporting substrate 16 or bend the supporting substrate 16. That is, it is possible to form the color filter 20 or the microlens 21 in a state where the supporting substrate 16 is completely parallel to the semiconductor substrate 4. Therefore, it is possible to form the color filter 20 or the microlens 21 as originally designed, which improves a yield ratio and reduces the fabrication cost.

In addition, according to the back-illuminated type imaging device 100, the plurality of pillars 9 connected to the pad portions 17 are arranged two-dimensionally. Therefore, it is possible to provide advantages that the electrical resistance is decreased and that bonding properties to the pad electrode are improved.

In addition, according to the back-illuminated type imaging device 100, the supporting substrate 16 and the semiconductor substrate 4 are made of the same material. Therefore, it is possible to provide advantages that post-generated white defects can be prevented and that damages to the semiconductor substrate 4, which may be caused during a sintering process, can be reduced.

In addition, according to the back-illuminated type imaging device 100, the pad portions 17 and the light shielding films 18 and 19 are made of the same material. Therefore, it is possible to form the pad portions simultaneously with the light shielding films as described in the above fabrication method, which reduces the fabrication cost.

In addition, although the back-illuminated type imaging device 100 has been described as being a MOS type imaging device, the imaging device may be a CCD type imaging device. Also, marks for inspecting misalignment of the components on the back-surface side may be formed in the semiconductor substrate 4. These marks may be formed of a plurality of pillars.

What is claimed is:

1. A method for fabricating a back-illuminated type imaging device in which light is illuminated from a back-surface side of a semiconductor substrate, and charges that are generated in response to the light are read out from a front-surface side of the semiconductor substrate to perform imaging, the method comprising:
    forming a plurality of first through holes in a plane area, on which pad portions to be formed on the back surface of the semiconductor substrate is to be formed, from the front-surface side of the semiconductor substrate so that the through holes extends from the front surface of the semiconductor substrate and reaches the back surface;
    filling the plurality of first through holes with a conductive material to form a plurality of first pillars made of the conductive material;
    forming wiring portions on the front surface of the semiconductor substrate so that the wiring portions are connected to the plurality of first pillars; and
    after the wiring portions are formed, forming the pad portions on the back surface of the semiconductor substrate so that the pad portions are connected to the plurality of first pillars.

2. The method for fabricating the back-illuminated type imaging device according to claim 1, wherein in the forming of the first through holes, the plurality of first through holes are formed so as to be arranged two-dimensionally, when viewed in plan view.

3. The method for fabricating the back-illuminated type imaging device according to claim 1, wherein in the forming of the first through holes, the plurality of first through holes are formed so that portions of the first through holes at which the through holes have a maximum width have 2 μm or less in length.

4. The method for fabricating the back-illuminated type imaging device according to claim 1, wherein
in the forming of the first through holes, a plurality of second through holes are formed in a plane area, in which a alignment mark that is used to align components on the front-surface side of the semiconductor substrate with components on the back-surface side are to be formed, so that the second through holes extends from the front surface of the semiconductor substrate and reaches the back surface,
in the filling of the first through holes, the plurality of second through holes are filled with the conductive material to form a plurality of second pillars made of the conductive material, and
the alignment mark is formed by the pattern of the plurality of second pillars.

5. The method for fabricating the back-illuminated type imaging device according to claim 4, wherein in the forming of the first through holes, the plurality of second through holes are formed so as to be arranged two-dimensionally, when viewed in plan view.

6. The method for fabricating the back-illuminated type imaging device according to claim 5, wherein in the forming of the first through holes, a pattern of the plurality of second through hole is formed so as to be symmetric.

7. The method for fabricating the back-illuminated type imaging device according to claim 4, wherein in the forming of the first through holes, the plurality of second through holes are formed so that portions of the second through holes at which the through holes have a maximum width have 2 μm or less in length.

8. The method for fabricating the back-illuminated type imaging device according to claim 1, further comprising
forming pixel portions in the semiconductor substrate, the pixel portions having charge storage areas for storing therein the charges, wherein
the forming of the pad portions includes
forming a film of a conductive material having a light shielding property, on the back surface, and
removing the conductive material at portions outside at least one of a portion above a plane area in which the pad portions are formed, a portion above a part of the pixel portions, and a portion above a boundary between the pixel portions.

9. The method for fabricating the back-illuminated type imaging device according to claim 8, further comprising
after the pad portions are formed, forming color filters above the pixel portions, so as to correspond to the pixel portions; and
after the pad portions are formed and before the color filters are formed, heating the semiconductor substrate.

10. The method for fabricating the back-illuminated type imaging device according to claim 1, wherein
the semiconductor substrate is a first semiconductor substrate of a SOI substrate, the SOI substrate comprising the first semiconductor substrate, a second semiconductor substrate, and an oxide film sandwiched between the first and second semiconductor substrates,
the method further comprising:
after the wiring portions are formed, bonding a supporting substrate on the front-surface side of the first semiconductor substrate via an inorganic adhesive film.

11. The method for fabricating the back-illuminated type imaging device according to claim 10, wherein the supporting substrate is made of the same material as the first semiconductor substrate.

12. The method of fabricating the back-illuminated type imaging device according to claim 1, wherein the wiring portions are formed after formation of the first pillars.

* * * * *